(12) United States Patent
Chen et al.

(10) Patent No.: US 11,175,334 B2
(45) Date of Patent: Nov. 16, 2021

(54) METHOD AND DEVICE FOR CALCULATING HOUSEHOLD APPLIANCE FAULTS

(71) Applicant: Qingdao Haier Air Conditioner General Corp., Ltd., Shandong (CN)

(72) Inventors: Dong Chen, Shandong (CN); Yongfu Cheng, Shandong (CN); Li Guo, Shandong (CN); Pengan Li, Shandong (CN); Xiaofei Zhang, Shandong (CN)

(73) Assignee: Qingdao Haier Air Conditioner General Corp., Ltd., Shandong (CN)

( * ) Notice: Subject to any disclaimer, the term of this patent is extended or adjusted under 35 U.S.C. 154(b) by 235 days.

(21) Appl. No.: 16/472,583

(22) PCT Filed: Apr. 28, 2018

(86) PCT No.: PCT/CN2018/085033
§ 371 (c)(1),
(2) Date: Jun. 21, 2019

(87) PCT Pub. No.: WO2018/201997
PCT Pub. Date: Nov. 8, 2018

(65) Prior Publication Data
US 2019/0324078 A1    Oct. 24, 2019

(30) Foreign Application Priority Data
May 2, 2017    (CN) .......................... 201710302175.1

(51) Int. Cl.
*G01R 31/28*    (2006.01)
*G06Q 30/00*    (2012.01)

(52) U.S. Cl.
CPC ....... *G01R 31/2825* (2013.01); *G06Q 30/016* (2013.01)

(58) Field of Classification Search
None
See application file for complete search history.

(56) References Cited

U.S. PATENT DOCUMENTS

| | | | | |
|---|---|---|---|---|
| 4,977,394 A | * | 12/1990 | Manson | ............ G05B 23/0286 340/679 |
| 2010/0027770 A1 | * | 2/2010 | Park | ...................... H04B 11/00 379/106.01 |

(Continued)

FOREIGN PATENT DOCUMENTS

| | | |
|---|---|---|
| CN | 103150237 A | 6/2013 |
| CN | 103500378 A | 1/2014 |

(Continued)

OTHER PUBLICATIONS

International Search Report from Application No. PCT/CN2018/085033 dated Jul. 6, 2018.

(Continued)

*Primary Examiner* — Harry S Hong
(74) *Attorney, Agent, or Firm* — Marshall, Gerstein & Borun LLP

(57) ABSTRACT

The present disclosure discloses a method for counting faults of household appliances and belongs to the field of fault processing of household appliances. The method includes: acquiring operating parameter information of a plurality of household appliances, where the plurality of household appliances being equipped with preset parts; acquiring fault information of at least one faulty household appliance in the plurality of household appliances, where the fault information includes fault codes; and determining a fault of the faulty household appliance and a fault rate of the plurality of household appliances corresponding to the fault according to the operating parameter information and the fault codes. In addition, the present disclosure further provides a device for counting faults of household appliances.

(Continued)

The method or the device according to the present disclosure can be adopted to count the fault rates of the plurality of household appliances equipped with preset parts.

17 Claims, 3 Drawing Sheets

(56) References Cited

U.S. PATENT DOCUMENTS

2014/0244768 A1  8/2014  Shuman et al.
2017/0004508 A1  1/2017  Mansfield et al.

FOREIGN PATENT DOCUMENTS

| CN | 105139206 A | 12/2015 |
| CN | 105894098 A | 8/2016 |
| CN | 107169700 A | 9/2017 |

OTHER PUBLICATIONS

Office action from Chinese Application No. 201710302175.1 dated Apr. 1, 2019.
International Preliminary Report on Patentability from International Application No. PCT/CN2018/085033 dated Nov. 5, 2019.
Search Report from European Application No. 18794374.1 dated Apr. 1, 2020.
Office Action from Chinese Application No. 201710302175.1 dated Aug. 27, 2019.

\* cited by examiner

METHOD AND DEVICE FOR CALCULATING HOUSEHOLD APPLIANCE FAULTS

This is the U.S. national phase of International Application No. PCT/CN2018/085033, filed Apr. 28, 2018, which claims the benefit of Chinese patent application No. 201710302175.1, filed May 2, 2017, the entire contents of which are hereby incorporated by reference.

TECHNICAL FIELD

The present disclosure relates to the field of fault processing of household appliances, and particularly relates to a method and a device for counting faults of household appliances.

BACKGROUND

Household appliances may fail during use. Whenever a fault occurs, a common processing mode is to contact with an after-sales service department; and the after-sales service department will designate a repairman to repair after preliminarily judging the situation according to a described state. Parts of intelligent household appliances need to be constantly updated and iterated. When novel parts are qualified and put into pilot production, there are problems about how to acquire and analyze application effects or fault information more quickly and provide some data references for the subsequent improvement and mass production of the parts. In the current market, the faults of the household appliances are generally analyzed and fed back on site by after-sales personnel on the market, so the efficiency is not high; equipment faults caused by the preset parts cannot be tracked, summarized and analyzed after the preset parts are applied to the household appliances. With the development of Internet of Things (IOT) technology, the use of IOT household appliances is increasingly widespread, thereby providing a technical support for solving the above problems.

SUMMARY

Embodiments of the present disclosure provide a method and a device for counting faults of household appliances, so as to solve a problem that equipment faults caused by preset parts cannot be tracked, summarized and analyzed after the preset parts are applied to the household appliances in the related art. In order to basically understand some aspects of the disclosed embodiments, a brief summary is given below. The summary is not a general comment, nor tends to determine key/critical constituent elements or describe a protection scope of these embodiments, and merely aims to present some concepts in a simplified form as an introduction of the following detailed description.

A method for counting faults of household appliances is provided according to a first aspect of embodiments of the present disclosure.

In some exemplary embodiments, the method for counting the faults of the household appliances includes:
acquiring operating parameter information of a plurality of household appliances, where the plurality of household appliances being equipped with preset parts;
acquiring fault information of at least one faulty household appliance in the plurality of household appliances, where the fault information includes fault codes; and
determining a fault of the faulty household appliance and a fault rate of the plurality of household appliances corresponding to the fault according to the operating parameter information and the fault codes.

In some illustrative embodiments, the determining the fault rate of the plurality of household appliances according to the operating parameter information and the fault codes includes:
determining the fault of the faulty household appliance according to the operating parameter information and the fault code; and
determining the fault rate of the plurality of household appliances according to the fault of the faulty household appliance.

In some illustrative embodiments, after determining the fault rate, the method further includes: comparing the fault rate with a preset fault threshold; and
transmitting the fault rate to a fault counting system when the fault rate is greater than the fault threshold.

In some illustrative embodiments, after determining the fault of the faulty household appliance, the method further includes:
acquiring user information of the faulty household appliance; and
determining a customer service server and transmitting the fault of the faulty household appliance to the customer service server according to the user information.

In some illustrative embodiments, the method further includes:
acquiring machine codes of the plurality of household appliances, where the machine codes include household appliance types, production plants and line bodies, production dates and part batches.

A device for counting faults of household appliances is provided according to a second aspect of the present disclosure.

In some exemplary embodiments, the device for counting the faults of the household appliances includes:
a signal receiver, configured to acquire operating parameter information of a plurality of household appliances, where the plurality of household appliances being equipped with preset parts, and acquire fault information of at least one faulty household appliance in the plurality of household appliances, where the fault information includes fault codes; and
a processor, configured to determine fault rates of the plurality of household appliances according to the operating parameter information and the fault codes.

In some optional embodiments,
the processor is further configured to determine a fault of the faulty household appliance according to the operating parameter information and the fault codes and determine the fault rate according to the fault of the faulty household appliance.

In some optional embodiments, the device further includes a signal transmitter.

The processor is further configured to compare the fault rate with a preset fault threshold, and transmit the fault rate to the signal transmitter when the fault rate is greater than the fault threshold.

The signal transmitter is configured to transmit the fault rates to a fault counting system.

In some optional embodiments,
the signal receiver is further configured to acquire user information of the faulty household appliance; and the signal transmitter is further configured to transmit the fault of the faulty household appliance to a customer service server according to the user information.

In some optional embodiments, the signal receiver is further configured to acquire machine codes of the plurality of household appliances, where the machine codes include household appliance types, production plants and line bodies, production dates and part batches. A problem that the fault information of a plurality of household appliances equipped with small batches of parts cannot be tracked and summarized in the related art is solved.

The method and the device for counting the faults of the household appliances provided by embodiments of the present disclosure can count the fault rates of the plurality of household appliances equipped with the preset parts.

It should be understood that the above general descriptions and the following detailed descriptions are merely exemplary and illustrative and not restrictive to the present disclosure.

BRIEF DESCRIPTION OF THE DRAWINGS

The accompanying drawings herein, which are incorporated in the description and constitute a part of the description, illustrate embodiments consistent with the present disclosure and serve to explain principles of the present disclosure together with the description.

DETAILED DESCRIPTION

Figure 1:
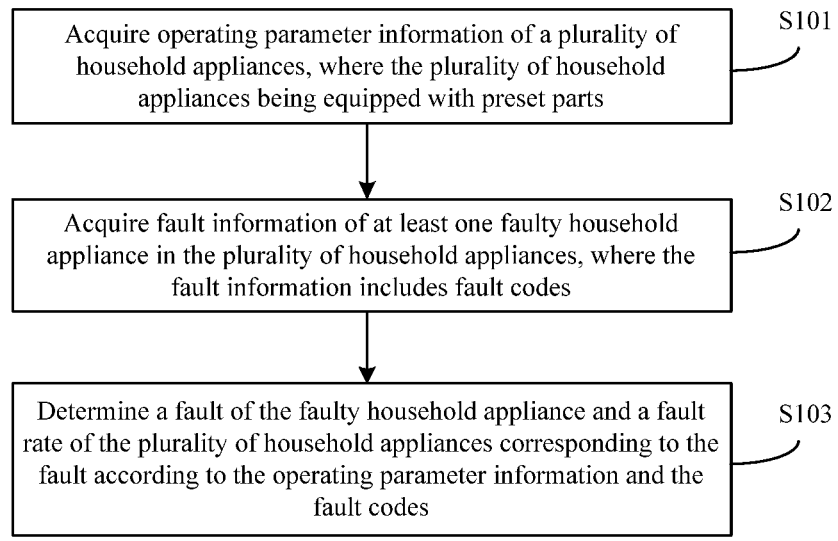
FIG. 1 is a flow chart of a method for counting faults of household appliances according to an exemplary embodiment.

The following description and accompanying drawings fully illustrate specific embodiments of the present disclosure so that those skilled in the art can practice the specific embodiments. Embodiments merely represent possible variations. Individual components and functions are optional unless explicitly required, and a sequence of operations is variable. Parts and features of some embodiments may be included in or substituted for parts and features of other embodiments. A scope of embodiments of the present disclosure includes a full scope of claims and available equivalents of the claims. In this description, various embodiments may be individually or generally represented by a term "disclosure" for convenience merely. When more than one disclosure is actually disclosed, the scope of the application is not automatically limited to any individual disclosure or inventive concept. In this description, relational terms such as first, second, etc. are merely used to distinguish one entity or operation from another entity or operation, and do not require or imply any actual relationship or order among these entities or operations. Moreover, the terms such as "include", "contain" or any other variation thereof are intended to cover non-exclusive inclusions, such that a process, method or apparatus including a series of elements not merely includes those elements, but also includes other elements not explicitly listed. Each embodiment herein is described in a progressive manner, and focuses on illustrating differences from other embodiments. Same and similar parts of the various embodiments can be referred to each other. Structures, products and the like disclosed in embodiments correspond to the parts disclosed in embodiments, and thus are described relatively simply; and the relevant parts refer to the descriptions of the method.

In the present disclosure, preset parts refer to a type of parts having the same structural features and functional characteristics, such as parts produced by the same manufacturer on the same production date through the same production process.

Fault codes refer to fault signals generated after household appliances fail, such as external fan overload protection, shell top high-temperature protection, communication fault, evaporator anti-freeze protection, system high-temperature protection, and the like.

Faults refer to faults of the household appliances determined according to one or more fault codes and operating state parameters of the household appliances, including room temperature sensor fault, refrigeration system fault, tube temperature sensor fault, overcurrent protection and the like. A fault category refers to classification of the faults, corresponds to one or more faults, and can be understood as division of fault types.

A fault counting system refers to a system for counting equipment faults caused by different preset parts. When the fault counting system is a manufacturing plant system, a manufacturing plant can perform key restoration analysis on the preset parts according to counting results and perform technical improvement on the preset parts.

FIG. 1 is a flow chart of a method for counting faults of household appliances according to an exemplary embodiment.

In some exemplary embodiments, the method for counting the faults of the household appliances includes:

step S101, operating parameter information of a plurality of household appliances are acquired, and the plurality of household appliances are equipped with preset parts;

step S102, fault information of at least one faulty household appliance in the plurality of household appliances is acquired, and the fault information includes fault codes; and step S103, a fault of the faulty household appliance and a fault rate of the plurality of household appliances corresponding to the fault are determined according to the operating parameter information and the fault codes.

Optionally, the operating parameter information of the faulty household appliances is determined according to the acquired operating parameter information of the plurality of household appliances in the step S103; and the fault rate of the plurality of household appliances is determined according to the operating parameter information and the fault codes of the faulty household appliance.

The fault rate corresponds to the faults of the plurality of household appliances, while the faults are determined according to the operating parameter information and the fault codes of the faulty household appliances. Specifically, the faults are determined according to a preset fault judgment strategy, and the fault judgment strategy includes the fault codes and the operating parameter information corresponding to the faults.

Further, the number of household appliances having this fault in the plurality of household appliances is counted according to a determined fault; and then, the fault rate corresponding to the fault is calculated. The fault rate is a proportion of the household appliances having this fault in the plurality of household appliances.

The operating parameter information at least includes operating state parameters, and may further include operating time points of the household appliances. The fault information at least includes the fault codes.

The method for counting the faults of the household appliances according to the above embodiment can be adopted to count the fault rates of the plurality of household appliances equipped with the preset parts, thereby solving a problem that fault information of the plurality of household appliances equipped with small batches of parts cannot be tracked and summarized in the related art.

In some optional embodiments, the step that the fault rates of the plurality of household appliances are determined according to the operating parameter information and the fault codes includes: the faults of the faulty household appliances are determined according to the operating parameter information and the fault codes; and the fault rates of the plurality of household appliances are determined according to the faults of the faulty household appliances.

Optionally, a preset analysis strategy is set for a local terminal and includes different fault codes, different operating state parameters and corresponding faults. The faults of the faulty household appliances can be determined by querying the analysis strategy according to the operating state parameters and the fault codes of the faulty household appliances.

Figure 2:
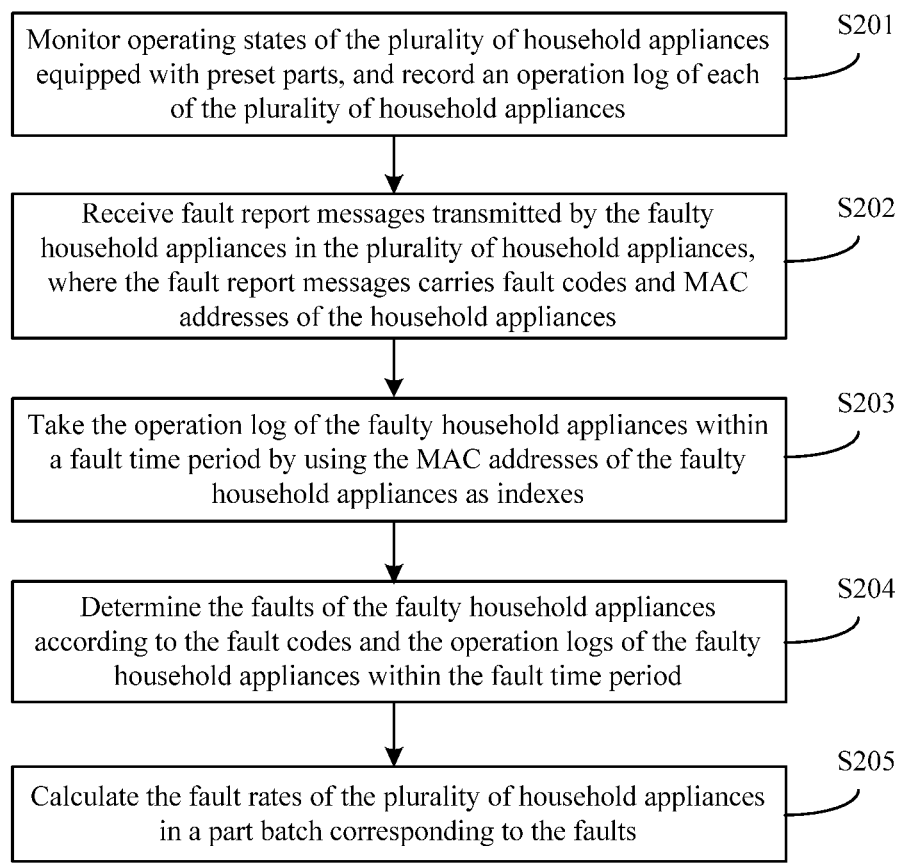
FIG. 2 is a specific flow chart of a method for counting faults of household appliances according to an exemplary embodiment.

The present embodiment is illustrated by an example through FIG. 2 below. As shown in the FIG. 2, the method includes:

step S201, operating states of the plurality of household appliances equipped with the preset parts are monitored; and the operating parameter information, i.e., an operation log, of each of the plurality of household appliances is recorded in a database.

The database stores a media access control (MAC) address, the operation log and the part batches of each of the plurality of household appliances. The operation log is a summary of monitoring results of the operating states of the plurality of household appliances and records one or more operating state parameters corresponding to different operating time points.

Since the plurality of household appliances are equipped with the preset parts, the part batches of the plurality of household appliances are the same. The part batches correspond to the preset parts.

Step S202, fault report messages transmitted by the faulty household appliances in the plurality of household appliances are received, and the fault report messages carry the fault codes and the MAC addresses of the faulty household appliances.

Step S203, the operation log of the faulty household appliances within a fault time period is taken from the database by using the MAC addresses of the faulty household appliances as indexes.

The fault time period is a time period in a fixed duration before and after a time point when the fault report messages are received. Further, the fixed duration is 10 min. When the time point of the fault report messages is 10:00, then the fault time period is 10 min before 10:00 and 10 min after 10:00, i.e., from 9:50 to 10:10.

Step S204, the faults of the faulty household appliances are determined according to the fault codes and the operation logs of the faulty household appliances within the fault time period and are recorded in the database.

Step S205, the fault rates of the plurality of household appliances in the part batches corresponding to the faults are calculated.

Since the MAC address of each household appliance is unique in the database, the MAC address of each household appliance can be used as the index to query the operating state parameter, the part batch, the fault category and other information corresponding to the household appliance. In addition, the operating state parameters, i.e., the operation logs, of the household appliance detected in different time periods are stored in the database.

Further, since the operating state parameters of the household appliance need to be recorded continuously, the amount of data in this portion is relatively large. In order to reduce the amount of stored data and speed up the data processing, the portion of data are first recorded in a cache; and a storage time is set to 30 min. When the household appliance does not fail within the preset time of 30 min, the data are not stored and are replaced with new records. When the household appliance fails within the preset time of 30 min, the recorded operating state parameters of one household appliance within the fixed time period, such as the time period of 10 min before and after the time point when the fault report messages are received, are taken according to the MAC address of the household appliance. When the taken operating state parameters of the household appliance are stored in the cache, the portion of information is stored in the database.

The method for counting the faults of the household appliances provided by embodiments of the present disclosure is adopted to monitor operating states of the plurality of household appliances equipped with the preset parts, analyze the fault category of the household appliance after one of the plurality of household appliances fails, and count the fault rate of the fault category of the plurality of household appliances equipped with the preset parts.

In some optional embodiments, in step S205, fault information of the plurality of household appliances is determined according to the part batches and the fault categories; and the fault rates of the plurality of household appliances in the part batches corresponding to the fault categories are calculated according to the number of household appliances having the fault categories in the plurality of household appliances recorded in the fault information.

The fault information of all the household appliances equipped with the batches of parts may be recorded in the database, so that the number of the household appliances having the fault category and the number of times that each household appliance generates the fault category can be acquired according to the fault information. For example, the number of the household appliances equipped with the parts in batch 101 is 100, and the refrigeration system fault as the fault category occurs in 60 household appliances. When the fault rate is a percentage of the number of household appliances transmitting fault messages in the total number of household appliances, the fault rate is 60%.

In some optional embodiments, after the fault rate is determined, the method further includes: the fault rate is compared with a preset fault threshold; and the fault rate is transmitted to the fault counting system when the fault rate is greater than the fault threshold.

When the fault rate is calculated and transmitted to the fault counting system every time, the data receiving and processing capacity of the fault counting system will be too large. In addition, the frequency of occurrence of some fault categories is extremely low; and the fault rates of the fault categories cannot represent the equipment fault caused by the part batches. Thus, it is not suitable for transmitting the information to the fault counting system.

In order to solve the above problems, a judgment process is added before the fault rates are transmitted to the fault counting system. The fault rates are compared with the preset fault threshold. When the fault rates are greater than the fault threshold, the operation of transmitting the fault rates to the fault counting system is performed.

The preset fault threshold is inputted in advance; different part batches and different fault categories correspond to different fault rates; and further, the fault threshold is 20%.

In some optional embodiments, after the faults of the faulty household appliances are determined, the method further includes:

user information of the faulty household appliances is acquired; and the faults of the faulty household appliances are transmitted to a customer service server according to the user information.

Optionally, the user information may be recorded in the database, or acquired by receiving a message transmitted by a user side. The user information may include a user telephone and address.

Further, a fault processing request is transmitted to the customer service server in the above embodiment, and the fault processing request carries the faults of the household appliances and the user information. The purpose of transmitting the user information is to enable the customer service server to acquire the user telephone and address, and to provide after-sales service more quickly. When the fault processing request merely carries the faults of the faulty household appliances and the MAC addresses of the faulty household appliances, the customer service server can also know how to provide after-sales service according to the faults, and query the user addresses according to the MAC addresses of the faulty household appliances, i.e., household appliance installation addresses.

In some optional embodiments, in order to provide after-sales service to the users more quickly, the fault processing request is transmitted to the customer service server where the faulty household appliance is located. Specifically, the customer service server is determined according to the user address.

In some optional embodiments, the method further includes:

machine codes of the plurality of household appliances are acquired, and the machine codes include household appliance types, production plants and line bodies, production dates and part batches.

Optionally, the machine codes include the household appliance types, the production plants and line bodies, the production dates and the part batches.

Further, each machine code is composed of 20 digits or letters; and meanings of characters at different bits in the machine code are defined, including information of the household appliance type, the production plant and line body, the production date and the part batch.

Further, the first 9 bits of the machine code represent the household appliance type; the 10th to 11th bits represent the part batch; the 12th to 13th bits represent the production plant and line body; the 14th to 16th bits represent the production date; and the 17th to 20th bits represent a serial number of the machine in the part batch.

For example, a machine code is AB8ZF0U0601NSGA50120, wherein AB8ZF0U06 represents the 9 codes corresponding to the household appliance type; 01 represents the part batch; NS represents the production plant and line body; GA5 represents that the production date is Oct. 5, 2016; and 0120 represents that the serial number of machine in the part batch is 120th.

In the above embodiment, in order to provide data transmission and recognition speeds, the machine code is defined so that the machine code includes a variety of machine information, such as the household appliance type, the production plant and line body, the production date, the part batch, and the like; and the above information can be acquired quickly by recognizing the information corresponding to each bit of the machine code.

In some optional embodiments, before the operating parameter information of the plurality of household appliances is acquired, the method further includes:

a distribution network binding success message transmitted by each of the plurality of household appliances is received; and an operating state acquisition message is transmitted to each of the plurality of household appliances so that the household appliances report operating states in real time.

Further, the operating state acquisition message carries a reporting period, and the reporting period is 30 s.

Figure 3:
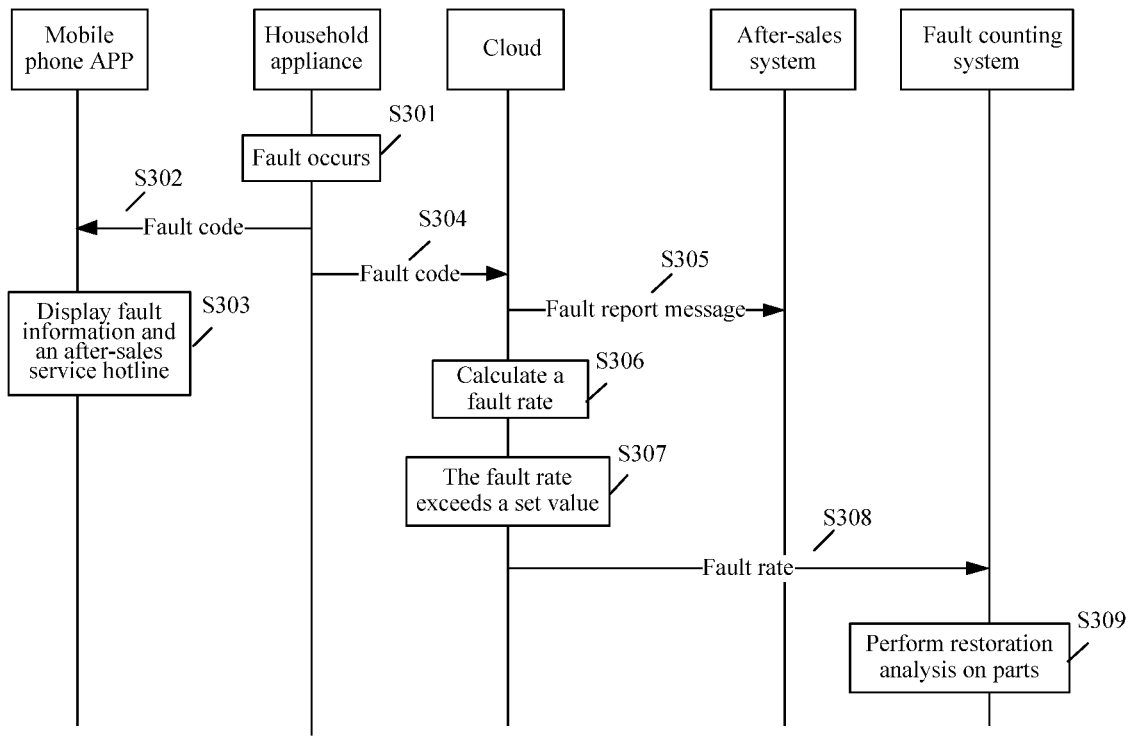
FIG. 3 is a specific flow chart of a method for counting faults of household appliances according to an exemplary embodiment.

The present embodiment discloses a process of establishing a communication connection and a message of requesting each of the plurality of household appliances to report the operating state. In order to illustrate the method in the above embodiment in more details, FIG. 3 is a specific flow chart of the method in the embodiment of the FIG. 1 during application. As shown in FIG. 3, the method includes a cloud, the household appliances and a mobile phone application (APP).

The MAC address and the machine code of each household appliance are unique. After the household appliances are produced, the MAC addresses correspond to the machine codes one by one, and are stored in a server database, i.e., the cloud, wherein the machine codes may include the household appliance types, the production plants and line bodies, the production dates, small batch attributes and other information; and the small batch attributes are batch numbers of a small batch of new parts.

When a new part is the preset part, such as a novel temperature sensor, then a small batch of n household appliances are produced on a certain day, and all of the n household appliances are equipped with the novel temperature sensor.

The MAC addresses and machine codes of the small batch of n household appliances will be inputted into the cloud. The cloud can screen out a machine code information table of the n machines in pilot production from the data inputted in the database by means of the small batch attributes, i.e., the part batches which correspond to the novel temperature sensors, and reversely search for an MAC address table of the n machines.

The cloud may associate the information of the user telephones and addresses with the MAC addresses and the machine codes of the household appliances one by one after the household appliances are purchased and installed. Optionally, the user telephones and addresses may be inputted into the cloud after installation personnel complete installation, or may be inputted in the APP when the users log in the APP, and then are transmitted to the cloud by the APP for recording. The MAC address is uploaded to the cloud after a household appliance distribution network is bound, while the operating state of the household appliance is simultaneously reported to the cloud and the APP in real time, i.e., the APP can control or display the state of the household appliance after the household appliance completes equipment network access and is bound with the APP in this process. In addition, the household appliance will also report to the cloud, inform the cloud of the MAC address, and inform the cloud that a distribution network binding process with the mobile phone APP has been completed. The purpose of reporting the operating state to the cloud by the household appliance is to allow the cloud to record so that the cloud can take the operating state of the household appliance from the database within the time period before and after the household appliance fails, for example, variation tendency of various relevant parameters before and after the fault occurs, such as indoor and outdoor ambient temperatures, a coil pipe temperature, a compressor current and frequency, etc., after the household appliance transmits the fault code to the cloud; and thus, the cloud can analyze the fault category of the household appliance according to the fault code and the operating state.

By referring to FIG. 3, after the household appliance fails in step S301, the fault code is simultaneously reported to the cloud and the APP, i.e., steps S302 and S304.

Step S303, the APP displays the fault and fault information of the household appliance, and also displays a 400 after-sales service hotline.

Step S305, the cloud transmits a fault report message to an after-sales system, and the fault report message carries the fault category. Specifically, the cloud parses the household appliance type and the user telephone and address through the MAC address of the faulty household appliance, determines the fault category, i.e., a fault type and a solution, and transmits to the after-sales system of an after-sales outlet near the user address; and the after-sales outlet knows the fault of the household appliance after receiving the fault report message and actively contacts with the user for quick door-to-door processing. In this step, the cloud can determine the fault category according to the operating state of the household appliance monitored within a time period before and after the household appliance fails as well as the fault code fed back by the household appliance, then determines the solution corresponding to the fault category according to preset fault solving strategies, then screens out the after-sales system closest to the user according to the user address recorded by the cloud, transmits the fault report message to the after-sales system, and notifies the after-sales system of the after-sales service of the household appliance. Optionally, the fault report message carries the household appliance type, the user telephone and address, the fault category and the solution.

Step S306, the cloud calculates the fault rate according to the fault code and the operating state of the household appliance monitored within the time period before and after the household appliances fail.

Step S307, the cloud compares the fault rate with a set value, and when the fault rate is greater than the set value, then a step S308 is performed.

Step S308, the cloud transmits the fault rate to the fault counting system.

Specifically, the cloud parses the production plant and line body and the production date information from the database, and transmits the fault rate of the fault category to the fault counting system, so that development and manufacturing plants and new part suppliers perform restoration analysis and manufacturing process analysis on the parts.

The cloud can count the fault rates of different fault categories of the n household appliances equipped with the preset parts and feed back to development and manufacturing plant systems in this step.

In the present embodiment, the fault conditions of the n household appliances equipped with the preset parts are counted when messages about the faults of the household appliances are received; and the fault rates of the fault category in this batch of household appliances are counted. Specifically, the fault record conditions of the n household appliances can be taken through the small batch attributes from the database; then, the number of the household appliances in the fault category is counted; the fault rates are calculated according to the number; each fault rate is compared with a set threshold of the fault; a result is fed back to the development and manufacturing plants and the new part supplier for key restoration analysis when the fault rate is greater than the set value; and the monitoring is continued when the set value is not exceeded.

The method for counting the faults of the household appliances provided by the present embodiment enables the after-sales service to respond quickly after the household appliance fails and to actively contact the user for processing. Most importantly, the n household appliances equipped with the preset parts can be mainly tracked in the cloud, for analyzing effects, counting and feeding back the fault rates, and facilitating the research and development of the novel parts. A device for counting faults of household appliances is provided according to a second aspect of embodiments of the present disclosure.

Figure 4:
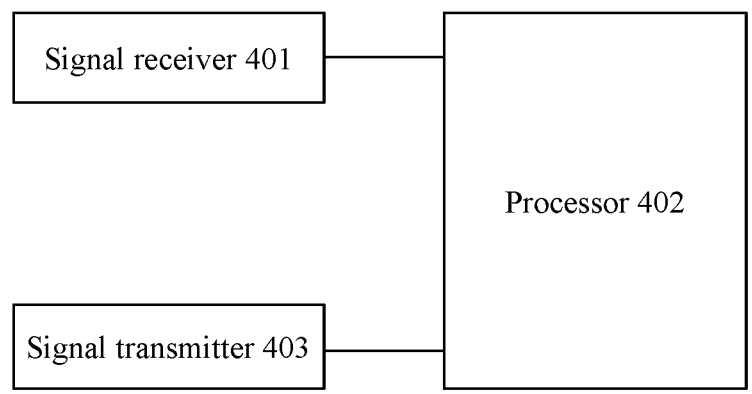
FIG. 4 is a block diagram illustrating a structure of a device for counting faults of household appliances according to an exemplary embodiment.

FIG. 4 is a block diagram illustrating a functional structure of a device for counting the faults of the household appliances according to an exemplary embodiment. As shown in FIG. 4, in some exemplary embodiments, the device includes:

a signal receiver 401, configured to acquire operating parameter information of a plurality of household appliances, wherein the plurality of household appliances is equipped with preset parts, and acquire fault information of at least one faulty household appliance in the plurality of household appliances, wherein the fault information includes fault codes; and a processor 402, configured to determine the fault of the faulty household appliance and a fault rate of the plurality of household appliances corresponding to the fault according to the operating parameter information and the fault codes.

Optionally, the processor 402 is further configured to determine the operating parameter information of the faulty household appliance according to the acquired operating parameter information of the plurality of household appliances and determine the fault rate of the plurality of household appliances according to the operating parameter information and the fault code of the faulty household appliance.

The fault rate corresponds to the faults of the plurality of household appliances, while the faults are determined according to the operating parameter information and the fault codes of the faulty household appliances. Specifically, the faults are determined according to a preset fault judgment strategy; and the fault judgment strategy includes the fault codes and the operating parameter information corresponding to the faults.

Further, the processor 402 is further configured to count the number of household appliances having this fault in the plurality of household appliances according to the determined fault, and calculate the fault rate corresponding to the fault. The fault rate is a proportion of the household appliances having the fault in the plurality of household appliances.

The operating parameter information at least includes operating state parameters, and may further include operating time points of the household appliances. The fault information at least includes the fault codes.

The method for counting the faults of the household appliances according to the above embodiment can be adopted to count the fault rates of the plurality of household appliances equipped with the preset parts, thereby solving a problem that fault information of the plurality of household appliances equipped with small batches of parts cannot be tracked and summarized in the related art.

In some optional embodiments, the processor 402 is further configured to determine the fault of the faulty household appliance according to the operating parameter information and the fault code and determine the fault rate of the plurality of household appliances according to the faults of the household appliances.

Optionally, the processor 402 determines the fault rate according to a preset analysis strategy. The analysis strategy includes different fault codes, different operating state parameters and corresponding faults. The processor 402 can determine the fault of the faulty household appliance by querying the analysis strategy according to the operating state parameter and the fault code of the faulty household appliance.

In some optional embodiments, the device further includes a signal transmitter 403.

The processor 402 is further configured to compare the fault rate with a preset fault threshold, and transmit the fault rate to the signal transmitter when the fault rate is greater than the fault threshold.

The signal transmitter 403 is configured to transmit the fault rates to a fault counting system.

When the fault rate is calculated and transmitted to the fault counting system every time, the data receiving and processing capacity of the fault counting system will be too large. In addition, the frequency of occurrence of some faults is extremely low; and the fault rates of the faults cannot represent the equipment fault caused by the part batches. Thus, it is not suitable to transmit the information to the fault counting system. In order to solve the above problems, a judgment process is added before the fault rates are transmitted to the fault counting system. The fault rates are compared with the preset fault threshold. When the fault rates are greater than the fault threshold, the operation of transmitting the fault rates to the fault counting system is performed.

The preset fault threshold is inputted in advance; different part batches and different faults correspond to different fault rates; and further, the fault threshold is 20%.

In some optional embodiments, the signal receiver 401 is further configured to acquire user information of the faulty household appliances; and the signal transmitter 403 is further configured to transmit the faults of the faulty household appliances to a customer service server according to the user information.

Optionally, the user information may be recorded in the database, or acquired by receiving messages transmitted by a user side. The user information may include the user telephone and address.

Further, the signal transmitter 403 transmits a fault processing request to the customer service server in the above embodiment, and the fault processing request carries the faults of the household appliances and the user information.

The purpose of transmitting the user information is to enable the customer service server to acquire the user telephone and address, and to provide after-sales service more quickly. When the fault processing request merely carries the fault of the faulty household appliance and the MAC address of the faulty household appliance, the customer service server can also know how to provide after-sales service according to the fault of the faulty household appliance, and query the user address according to the MAC address of the faulty household appliance, i.e., a household appliance installation address.

In some optional embodiments, the signal receiver 401 is further configured to acquire machine codes of the plurality of household appliances, and the machine codes include household appliance types, production plants and line bodies, production dates and part batches.

Optionally, the machine codes include the household appliance types, the production plants and line bodies, the production dates and the part batches.

Further, each machine code is composed of 20 digits or letters; and meanings of characters at different bits in the machine code are defined, including information of the household appliance type, the production plant and line body, the production date and the part batch.

Further, the first 9 bits of the machine code represent the household appliance type; the 10th to 11th bits represent the part batch; the 12th to 13th bits represent the production plant and line body; the 14th to 16th bits represent the production date; and the 17th to 20th bits represent a serial number of the machine in the part batch.

For example, a machine code is AB8ZF0U0601NSGA50120, wherein AB8ZF0U06 represents the 9 codes corresponding to the household appliance type; 01 represents the part batch; NS represents the production plant and line body; GA5 represents that the production date is Oct. 5, 2016; and 0120 represents that the serial number of machine in the part batch is 120th.

In the above embodiment, in order to provide data transmission and recognition speeds, the machine code is defined so that the machine code includes a variety of machine information, such as the household appliance type, the production plant and line body, the production date, the part batch, etc.; and the above information can be acquired quickly by recognizing the information corresponding to each bit of the machine code.

Figure 5:
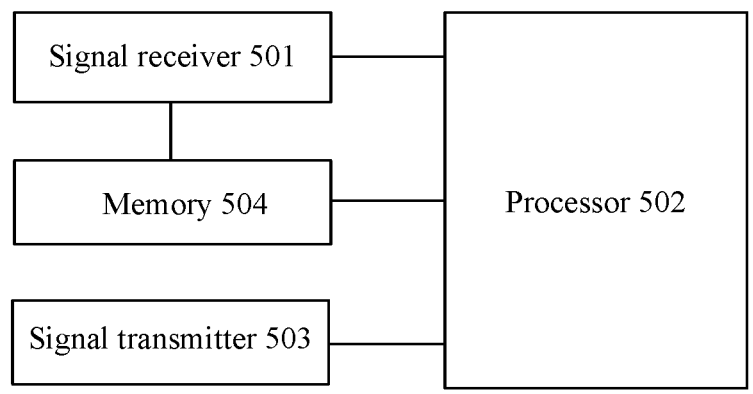
FIG. 5 is a structural block diagram of a device for counting faults of household appliances according to an exemplary embodiment.

FIG. 5 is a specific embodiment of the device according to the embodiment shown in FIG. 4. As shown in FIG. 5, in some exemplary embodiments, the device includes:

a signal receiver 501, configured to receive monitoring results of a plurality of household appliances equipped with the preset parts, wherein the monitoring results carry an operation log of each of the plurality of household appliances, and receive a fault report message transmitted by the faulty household appliance in the plurality of household appliances, wherein the fault report message carry the fault code and the MAC address of the faulty household appliance;

a processor 502, configured to take the operation log of the faulty household appliance in a fault time period by using the MAC address of the faulty household appliance as an index, wherein the fault time period is a time period in a fixed duration before and after a time point when the fault report message is received, determine the fault of the faulty household appliance according to the fault code and the operation log of the faulty household appliance in the fault time period, and calculate the fault rate of the plurality of household appliances in the part batches corresponding to the fault; and a signal transmitter 503, configured to transmit the fault rate to the fault counting system.

Since the plurality of household appliances are equipped with the preset parts, the part batches of the plurality of household appliances are the same. The part batches correspond to the preset parts. Further, the fixed duration is 10 min. When the time point of the fault report messages is 10:00, then the fault time period is 10 min before 10:00 and 10 min after 10:00, i.e., from 9:50 to 10:10. The device for counting the faults of the household appliances provided by embodiments of the present disclosure can be adopted to monitor the operating states of the plurality of household appliances equipped with the preset parts, analyze the fault of the household appliance after one of the plurality of household appliances fails, count the fault rate of the plurality of household appliances equipped with the same batch of parts and having this fault, and then transmit the fault rate to the fault counting system. The device provided by the present disclosure can be adopted to track and summarize the operating states, the faults and the corresponding fault rates of the plurality of household appliances equipped with the preset parts.

In some optional embodiments, the processor 502 is further configured to query fault information of the plurality of household appliances from the database according to the part batches and the faults of the faulty household appliances, and calculate the fault rates of the plurality of household appliances in the part batches corresponding to the faults according to the number of the faulty household appliances in the plurality of household appliances recorded in the fault information.

A method for calculating the fault rate by the processor is given in the above embodiment. The fault information of all the household appliances equipped with the batches of parts may be recorded in the database, so that the number of the household appliances having the fault and the number of times that each household appliance has the fault can be acquired according to the fault information. For example, the number of the household appliances equipped with the parts in batch 101 is 100, and the refrigeration system fault as the fault occurs in 60 household appliances. When the fault rate is a percentage of the number of household appliances transmitting the faults in the total number of household appliances, the fault rate is 60%.

In some optional embodiments, the processor 502 is further configured to compare the fault rate with the preset fault threshold, and transmit the fault rate to the signal transmitter when the fault rate is greater than the fault threshold.

In some optional embodiments, the operation log includes operating time points and operating state parameters corresponding to the operating time points.

The signal receiver 501 is further configured to receive the operating state report message transmitted by each of the plurality of household appliances.

The processor 502 is further configured to parse the operating state report message, and acquire the MAC address, the operating time point and the operating state parameters corresponding to the operating time point of each of the plurality of household appliances.

Further, in the above embodiment, the signal receiver 501 receives the operating state report message transmitted by each of the plurality of household appliances every fixed time; and the processor 502 acquires and records the operation log of each household appliance in the database by parsing the message. Further, the fixed time is 30 s.

In some optional embodiments, the device further includes:

a memory 504, configured to record the fault of the faulty household appliance determined by the processor 502 into the database, and store the operating parameter information of the plurality of household appliances acquired by the signal receiver 501, such as the operation log in the above embodiment.

It should be understood that the present disclosure is not limited to processes and structures described above and shown in the accompanying drawings, and can be subjected to various modifications and changes without departing from the scope thereof. The scope of the present disclosure is merely limited by the appended claims.

The invention claimed is:

1. A method for counting faults of household appliances, comprising:
    acquiring a MAC address for each of a plurality of household appliances;
    acquiring operating parameter information of the plurality of household appliances, wherein the plurality of household appliances are equipped with preset parts;
    indexing the operating parameter information of the plurality of household appliances based on the MAC address for each of the plurality of household appliances;
    acquiring fault information of at least one faulty household appliance in the plurality of household appliances, wherein the fault information includes fault codes and the MAC address of the at least one faulty household appliance;
    retrieving operating parameter information of the at least one faulty household appliance using the MAC address of the at least one faulty household appliance; and
    determining a fault of the faulty household appliance and a fault rate of the plurality of household appliances corresponding to the fault according to the operating parameter information and the fault codes.

2. The method according to claim 1, wherein the determining the fault rate of the plurality of household appliances according to the operating parameter information and the fault codes comprises:
    determining the fault of the faulty household appliance according to the operating parameter information and the fault code; and
    determining the fault rate of the plurality of household appliances according to the fault of the faulty household appliance.

3. The method according to claim 2, wherein after determining the fault rate, the method further comprises:
    comparing the fault rate with a preset fault threshold; and
    transmitting the fault rate to a fault counting system when the fault rate is greater than the fault threshold.

4. The method according to claim 2, wherein after determining the fault, the method further comprises:
    acquiring user information of the faulty household appliance; and
    determining a customer service server and transmitting, via a signal transmitter, the fault of the faulty household appliance to the customer service server according to the user information.

5. The method according to claim 1, further comprising:
    acquiring machine codes of the plurality of household appliances, wherein the machine codes include household appliance types, production plants and line bodies, production dates and part batches.

6. A device for counting faults of household appliances, comprising:
- a signal receiver, configured to acquire a MAC address for each of a plurality of household appliances, acquire operating parameter information of the plurality of household appliances, wherein the plurality of household appliances are equipped with preset parts; and acquire fault information of at least one faulty household appliance in the plurality of household appliances, wherein the fault information includes fault codes and the MAC address of the at least one faulty household appliance; and
- a processor, configured to index the operating parameter information of the plurality of household appliances based on the MAC address for each of the plurality of household appliances, retrieve operating parameter information of the at least one faulty household appliance using the MAC address of the at least one faulty household appliance, and determine a fault of the faulty household appliance and fault rates of the plurality of household appliances corresponding to the fault according to the operating parameter information and the fault codes.

7. The device according to claim 6, wherein
the processor is further configured to determine a fault of the faulty household appliance according to the operating parameter information and the fault codes, and determine the fault rate of the plurality of household appliances according to the fault of the faulty household appliance.

8. The device according to claim 7, wherein the device further comprises a signal transmitter;
the processor is further configured to compare the fault rate with a preset fault threshold, and transmit the fault rate to the signal transmitter when the fault rate is greater than the fault threshold; and
the signal transmitter is configured to transmit the fault rates to a fault counting system.

9. The device according to claim 7, wherein
the signal receiver is further configured to acquire user information of the faulty household appliance; and
the signal transmitter is further configured to transmit the fault of the faulty household appliance to a customer service server according to the user information.

10. The device according to claim 6, wherein
the signal receiver is further configured to acquire machine codes of the plurality of household appliances, wherein the machine codes comprise household appliance types, production plants and line bodies, production dates and part batches.

11. The method according to claim 2, further comprising:
acquiring machine codes of the plurality of household appliances, wherein the machine codes include household appliance types, production plants and line bodies, production dates and part batches.

12. The method according to claim 3, further comprising:
acquiring machine codes of the plurality of household appliances, wherein the machine codes include household appliance types, production plants and line bodies, production dates and part batches.

13. The method according to claim 4, further comprising:
acquiring machine codes of the plurality of household appliances, wherein the machine codes include household appliance types, production plants and line bodies, production dates and part batches.

14. The device according to claim 7, wherein
the signal receiver is further configured to acquire machine codes of the plurality of household appliances, wherein the machine codes comprise household appliance types, production plants and line bodies, production dates and part batches.

15. The device according to claim 8, wherein
the signal receiver is further configured to acquire machine codes of the plurality of household appliances, wherein the machine codes comprise household appliance types, production plants and line bodies, production dates and part batches.

16. The device according to claim 9, wherein
the signal receiver is further configured to acquire machine codes of the plurality of household appliances, wherein the machine codes comprise household appliance types, production plants and line bodies, production dates and part batches.

17. The method according to claim 1, wherein acquiring the operating parameter information includes
continuously recording the operating parameter information of the plurality of household appliances, and
determining whether at least one of the plurality of household appliances fails within a preset time frame.

* * * * *